(12) United States Patent
Kuijk et al.

(10) Patent No.: US 11,271,526 B2
(45) Date of Patent: Mar. 8, 2022

(54) ELECTRONIC MIXER

(71) Applicant: VRIJE UNIVERSITEIT BRUSSEL, Brussels (BE)

(72) Inventors: Maarten Kuijk, Antwerp (BE); Thomas Van Den Dries, Sint-Katelijne-Waver (BE)

(73) Assignee: VRIJE UNIVERSITEIT BRUSSEL, Brussels (BE)

( * ) Notice: Subject to any disclaimer, the term of this patent is extended or adjusted under 35 U.S.C. 154(b) by 0 days.

(21) Appl. No.: 16/965,390

(22) PCT Filed: Jan. 30, 2019

(86) PCT No.: PCT/EP2019/052305
§ 371 (c)(1),
(2) Date: Jul. 28, 2020

(87) PCT Pub. No.: WO2019/149788
PCT Pub. Date: Aug. 8, 2019

(65) Prior Publication Data
US 2021/0006204 A1    Jan. 7, 2021

(30) Foreign Application Priority Data
Jan. 30, 2018    (EP) .................................... 18154299

(51) Int. Cl.
*H03D 7/14* (2006.01)
*H01L 27/04* (2006.01)
*H01L 21/28* (2006.01)

(52) U.S. Cl.
CPC ..... *H03D 7/1433* (2013.01); *H01L 21/28202* (2013.01); *H01L 27/04* (2013.01); *H03D 2200/009* (2013.01)

(58) Field of Classification Search
CPC ..... H03D 7/1433; H01L 31/101; H01L 31/11; H01L 31/0352; H01L 27/04
See application file for complete search history.

(56) References Cited

U.S. PATENT DOCUMENTS 4,700,211 A * 10/1987 Popovic ................. G01R 33/06
257/423
4,831,423 A    5/1989 Shannon
(Continued)

FOREIGN PATENT DOCUMENTS

| EP | 2330637 A2 | 6/2011 |
| EP | 2330637 A3 | 7/2014 |
| WO | 2009090263 A1 | 7/2009 |

OTHER PUBLICATIONS

Extended Search Report and Written Opinion from corresponding EP Application No. 18154299, dated Jul. 17, 2018.
(Continued)

*Primary Examiner* — Aaron J Gray
(74) *Attorney, Agent, or Firm* — Workman Nydegger

(57) ABSTRACT

A mixer comprises a substrate of a first conductivity type; at least one minority carrier injector for injecting minority carriers in the substrate in reply to a first electrical signal applied to the at least one minority carrier injector; at least two substrate taps located in the substrate for providing a majority carrier current density with associated electric field in the substrate in reply to a second electrical signal applied to the at least two substrate taps. The majority carrier current density's associated electric field determines the drift direction of the injected minority carriers. The mixer further comprises at least two minority carrier collectors located in the substrate, for collecting minority carriers from the substrate. Each minority carrier collector is located adjacent to one of the at least two substrate taps. A minority carrier collector destination is determined by the drift direction of
(Continued)

the injected minority carriers, and current outputted by the minority carrier collectors based on the number of minority carriers collected at the collector destination, form an output signal of the mixer.

10 Claims, 7 Drawing Sheets

(56) References Cited

U.S. PATENT DOCUMENTS

| | | | |
|---|---|---|---|
| 4,939,563 A * | 7/1990 | Fang | H01L 29/82 |
| | | | 257/423 |
| 9,716,121 B1 * | 7/2017 | Fotopoulou | G01S 7/4863 |
| 2007/0164767 A1 * | 7/2007 | Herz | G01S 7/4816 |
| | | | 257/449 |
| 2018/0372846 A1 * | 12/2018 | Izuhara | G01S 17/894 |

OTHER PUBLICATIONS

International Search Report and Written Opinion from PCT Application No. PCT/EP2019/052305, dated Apr. 23, 2019.

* cited by examiner

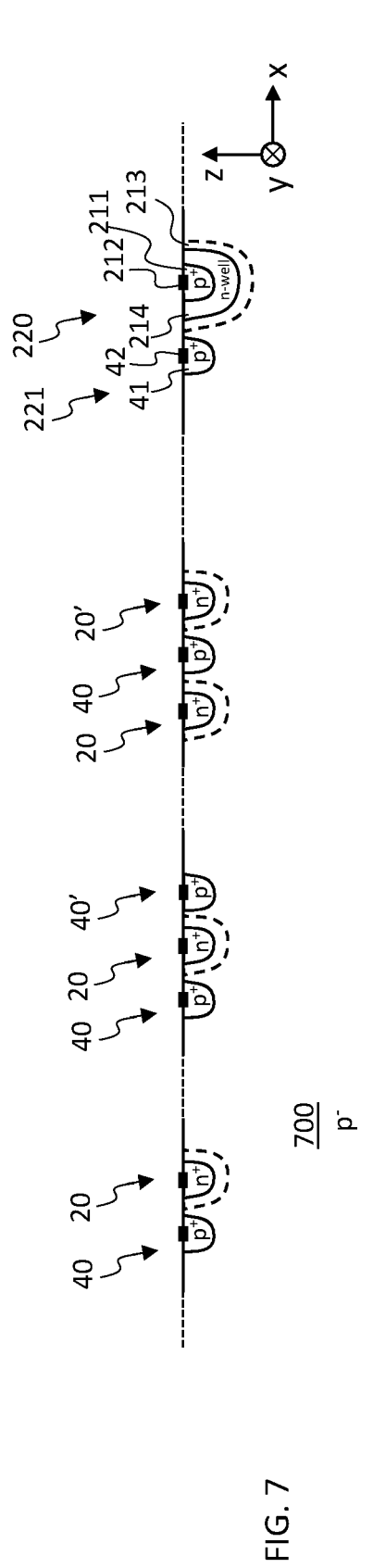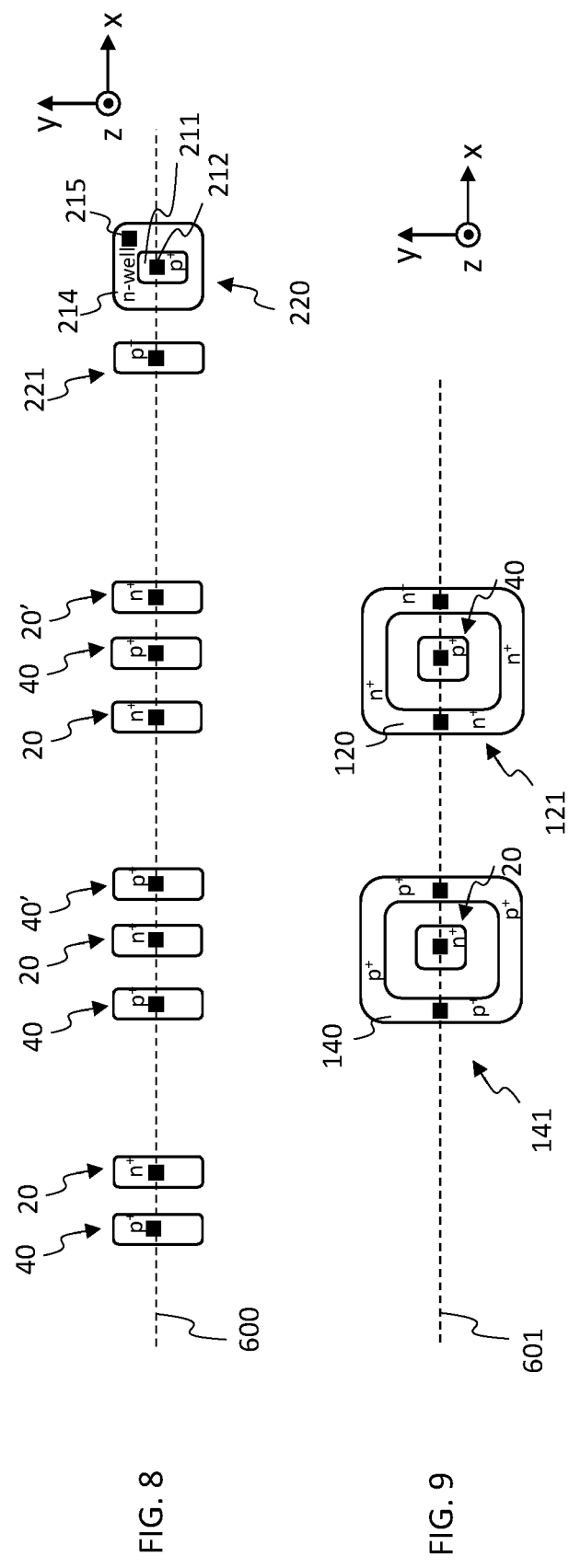

ELECTRONIC MIXER

FIELD OF THE INVENTION

The present invention relates to a mixer for mixing electrical signals.

BACKGROUND OF THE INVENTION

In most commercial systems that use electronic mixer circuits today, the mixing is fulfilled using diodes, CMOS or Bipolar transistors. Such electronic mixer circuits are known to the person skilled in the art. Mixing is used in many applications, including filtering, modulation, and demodulation. In wireless front-ends, at the receive side, the mixer is often preceded by an analog amplifier, because the transistors used for the mixer generate noise, limiting the signal to noise performance. The analog amplifier itself also generates noise. Whether to mix first or to amplify first is a matter of trade-off. Further, with most mixer structures it is difficult to mix a small current of the order of fA with another signal in a signal-to-noise friendly way.

SUMMARY OF THE INVENTION

It is an object of embodiments of the present invention to provide a good mixer for mixing electrical signals.

The above objective is accomplished by a method and device in accordance with embodiments of the present invention.

In a first aspect, the present invention provides a mixer comprising a substrate of a first conductivity type; at least one minority carrier injector for injecting minority carriers in the substrate in reply to a first electrical signal applied to the at least one minority carrier injector; at least two substrate taps located in the substrate, for providing a majority carrier current density with associated electric field in the substrate in reply to a second electrical signal applied to the at least two substrate taps. The majority carrier current density's associated electric field determines the drift direction of the injected minority carriers. The mixer further comprises at least two minority carrier collectors located in the substrate, for collecting minority carriers from the substrate. Each minority carrier collector is located adjacent to, e.g. close to, one of the at least two substrate taps, for instance separated therefrom not farther than a few micrometers, such as e.g. the distance between a minority carrier collector and a neighboring substrate tap may be between a few nanometers and a few micrometers, for instance the separation distance may be between 10 nm and 10 µm, e.g. between 100 nm and 5 µm. The at least one minority carrier injector, the at least one minority carrier collector and the at least two substrate taps are connected to the substrate such that when a majority carrier current flow is provided in the substrate, and minority carriers are injected in the substrate, the majority carrier current flow guides the minority carriers in the opposite direction of the majority carrier current flow, for collection by the minority carrier collector. Or, differently worded, in use (i.e. when the first and second electrical signals are applied), a minority carrier collector destination is determined by the drift direction of the injected minority carriers—which is determined by the majority current density's associated electric field—, and current outputted by the minority carrier collectors based on the number of minority carriers collected at the collector destination, form an output signal of the mixer.

A minority carrier collector, in the context of the present invention, is adapted for allowing the extraction of collected minority carriers, for instance via a contact which is connectable to additional electrical circuitry.

In embodiments of the present invention, the applied second electrical signal may be an n-phase signal, for instance a differential signal or a multi-phase signal. The number of phases of the second electrical signal may equal the number of available substrate taps.

In embodiments of the present invention, the mixer output signal may be an m-phase signal. The number of phase in the output signal may equal the number of available carrier collectors.

Features of a mixer in accordance with embodiments of the present invention may be located at or connected to a same side of the substrate. This, however, is not limiting, and one or more of these features may be located at or connected to a side of the substrate different from, e.g. opposite to, the side of the substrate where another one or more of these features are located at or connected to. For instance, one substrate tap may be provided at one side of the substrate, while another substrate tap is provided at another side thereof. This way, a more 3-dimensional layout may be obtained.

In particular embodiments of the present invention, minority carriers that are driven away and not collected by the at least one minority carrier collector can disappear by other means, like recombination for instance. In embodiments of the present invention, in order to improve the collection of the minority carriers from the substrate, two or more minority carrier collectors may be provided.

A mixer in accordance with embodiments of the present invention may comprise subsequent elements in the following order: a first substrate tap, a first minority carrier collector, a first minority carrier injector, a second minority carrier collector and a second substrate tap. Alternatively, a mixer in accordance with embodiments of the present invention may comprise subsequent elements in the following order: a first minority carrier collector, a first substrate tap, a first minority carrier injector, a second substrate tap and a second minority carrier collector. The sequence is determined by elements being neighboring. The neighboring elements may for instance be located on a straight line or a curve, e.g. a curve which does not intersect itself.

The at least two minority carrier collectors are each provided close to a substrate tap for providing a majority carrier current density. The distance between a minority carrier collector and a substrate tap for providing a majority carrier current density may for instance not be farther than a few micrometers, such as e.g. the distance between a minority carrier collector and a neighboring substrate tap may be between a few nanometers and a few micrometers, for instance the separation distance may be between 10 nm and 10 µm, e.g. between 100 nm and 5 µm.

A mixer in accordance with embodiments of the present invention may furthermore comprise at least one additional substrate tap provided on the substrate in between the at least one minority carrier injector and one of the at least two substrate taps for providing at least two majority carrier current flow densities between the at least one additional substrate tap and the at least two substrate taps. Although when not having symmetry, a working system can be obtained that can be good enough, preferably a symmetric system is provided. In that sense, a mixer in accordance with embodiments of the present invention preferably comprises at least two additional substrate taps. In embodiments of the present invention, many current flow directions may be obtained, and multiple outputs accordingly.

In a mixer in accordance with embodiments of the present invention, the at least one minority carrier injector may comprise a highly doped contact region of second conductivity type different from the first conductivity type. The highly doped contact region may be provided in a well of the first or second conductivity type. In embodiments of the present invention, the well may furthermore comprise a contact region of the first conductivity type.

In a mixer in accordance with embodiments of the present invention, a substrate tap for providing a majority carrier current density in the substrate may comprise a highly doped contact region of the first conductivity type. The highly doped contact region of the first conductivity type may be provided in a well of the first conductivity type.

In a second aspect, the present invention provides the use of a mixer according to any of the embodiments of the first aspect for mixing a first electrical signal with a second electrical signal. The use comprises applying the first electrical signal to the least one minority carrier injector, thus generating a minority carrier current in the substrate; applying the electrical signal between the at least two substrate taps, thus generating a majority carrier current in the substrate, the majority carrier current having an associated electric field guiding the minority carriers in the substrate in the opposite direction of the majority carrier current; and collecting minority carriers from the substrate by means of the at least one minority carrier collector. Over time, the minority carriers will be collected from the substrate by means of at least to minority carrier collectors.

In a third aspect, the present invention provides a method for mixing a first electrical signal with a second electrical signal. The method comprises generating, in response to the second electrical signal, a majority carrier current in a substrate extending between at least two substrate taps provided on the substrate; injecting, in response to the first electrical signal, minority charge carriers in the substrate at an injection spot provided on the substrate in between the at least two substrate taps; guiding the minority charge carriers in the substrate by means of the majority carrier current, in a direction opposite to the direction of the majority carrier current to at least one collection spot, the at least one collection spot being provided on the substrate in between the injection spot and one of the at least two substrate taps; and collecting minority charge carriers thus provided at the at least one collection spot, thus obtaining a mixed signal output.

In a method according to embodiments of the third aspect of the present invention, at least one of the first and second electrical signals may be a time variant signal.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which:

FIG. 7, FIG. 8 and FIG. 9 show various minority carrier collectors, close to substrate taps.

Figure 1:
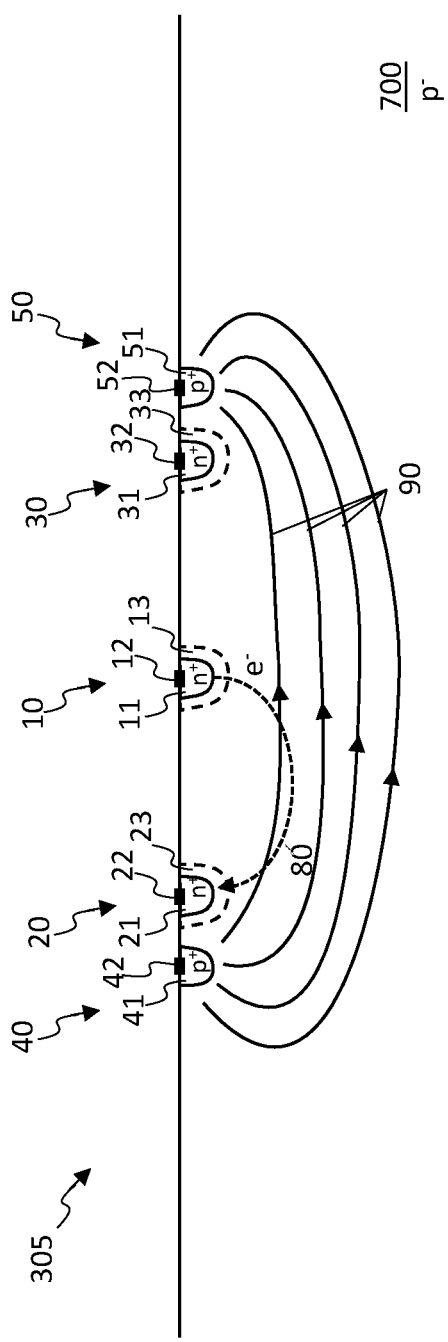
FIG. 1 and FIG. 2 show the cross section of a mixer structure in accordance with a first embodiment of the present invention.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, directional terminology such as top, bottom, front, back, leading, trailing, under, over and the like in the description and the claims is used for descriptive purposes with reference to the orientation of the drawings being described, and not necessarily for describing relative positions. Because components of embodiments of the present invention can be positioned in a number of different orientations, the directional terminology is used for purposes of illustration only, and is in no way intended to be limiting, unless otherwise indicated. It is, hence, to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

In the context of the present invention, a mixer is a device that combines two or more electrical or electronic signals into one or two composite output signals. Multiplicative mixers instantaneously multiply two time-variant input signals.

A mixer in accordance with embodiments of the present invention is implemented in semiconductor material. Semiconductor material can be doped, i.e. impurities (dopants) can be intentionally introduced into an intrinsic semiconductor with the purpose of modulating its electrical properties. Basically, there are two types of dopants: n-type dopants (donors) or p-type dopants (acceptors). P-type dopants create holes in the semiconductor lattice that are free to move. The result is an electrically conductive p-type semiconductor. In the context of the present invention, this is also called a semiconductor of a first conductivity type. N-type dopants add extra valence electrons that become unbonded from individual atoms and allow the compound to be an electrically conductive n-type semiconductor. In the context of the present invention, this is also called a semiconductor of a second conductivity type.

FIG. 1 is a cross-section of a mixer 305 in accordance with a first embodiment of the present invention. It is embedded in a substrate 700 of a first conductivity type, for instance a lowly doped p⁻-semiconductor substrate as an exemplary situation. A three-dimensional majority carrier current density 90 is introduced in the substrate 700 by applying suitable electrical signals to the substrate (e.g. voltage and/or current signals). The electrical signals may for instance be applied between substrate taps 40 and 50. The thus generated majority carrier current generates an associated electrical field distribution. In case of a p-type substrate as in the example illustrated, holes are the majority carriers and electrons are the minority carriers.

A minority carrier injector 10, injects minority carriers into the substrate 700. This can for instance be achieved by sinking in the substrate a current from an injection contact 12 of the minority carrier injector 10 through a region, e.g. diffusion, of a second conductivity type opposite to the first conductivity type, for instance in the example illustrated an n-diffusion 11, resulting in charge carriers that get injected into the substrate 700 as minority carriers. In the case the substrate 700 is of the p⁻-type, electrons are injected as minority carriers. From there, the minority carriers will see a drift field that is the result of the applied majority carrier current density 90 and will move in opposite direction of the flow of these majority carriers, for instance following a trajectory 80. In the situation illustrated in FIG. 1, the substrate tap 40, will be positive in voltage, compared to the substrate tap 50, hence the majority carrier current flowing in a direction from substrate tap 40 towards substrate tap 50. A minority carrier moving towards substrate tap 40, will have a large likelihood (e.g. of more than 90%) to get collected at a minority carrier collector 20 that is located close to the injection point of majority carriers, substrate tap 40, for instance not farther away than several hundreds of nanometers to some micrometers. The last part of its trajectory to get there can be based on diffusion.

Figure 2:
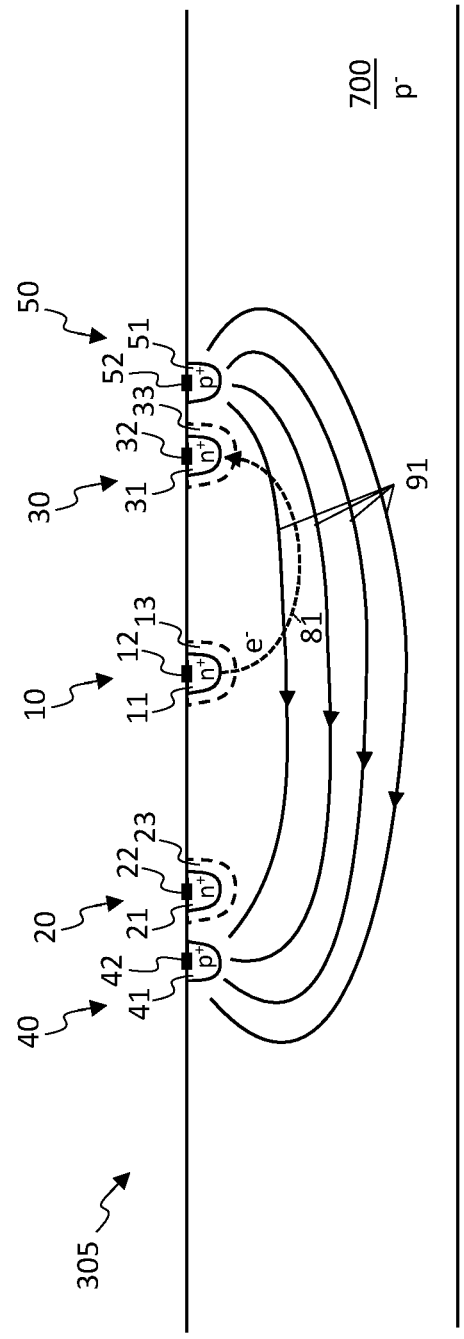

In FIG. 2, the three-dimensional majority carrier current density 91 is reversed in the substrate 700 compared to the majority carrier current density 90 illustrated in FIG. 1, for example by applying opposite electrical signals (e.g. voltage and/or current) on substrate taps 40 and 50 compared to the ones applied in FIG. 1. The opposite majority carrier current generates an associated opposite electrical field distribution compared to the one in FIG. 1. Minority carriers injected at minority carrier injector 10, will now move under these circumstances in the opposite direction, towards substrate tap 50, following trajectory 81, again opposite to the majority carrier flow. A minority carrier, in its path towards substrate tap 50, will be collected, possibly with the help of diffusion, by a minority carrier collector 30.

The injected minority carrier current can have a variable strength versus time, and in that way signals can get modulated, demodulated, mixed, up- and down converted. The differential output current on minority carrier collectors 20 and 30, becomes substantially the product of the applied input current on the minority carrier injector 10, multiplied with the differential majority carrier signal applied between the substrate taps 40 and 50. For signals between the substrate taps 40 and 50 that are small enough, e.g. of the order of tens to 100 millivolt, there will be a linear behavior; for larger differential signals, there will be saturation characterized by the fact that almost all injected minority carriers will go to the side of the substrate tap 40 or 50 that has the highest voltage. In typical applications, one wants a digital multiplication whereby e.g. the sign of a differential signal is determining. Often such signal is called LO (local oscillator), and selects digitally where the current/signal will go. Nevertheless, the mixer presented here can do any of the expected multiplication/mixer operations, as well linear, as saturated/digital. The minority carrier injector 10 has further a very broad linearity, over many orders of magnitude, from very small currents, of the order of fA to about 20% of the absolute value of amplitude of the majority carrier current going through substrate taps 40 and 50.

There are many ways that a mixer in accordance with embodiments of the present invention can be conceived. The example in FIG. 1 and FIG. 2 is a very basic one. The differential input between substrate taps 40, 50, can be seen as a current input. Taking the resistive substrate into account, the voltage on these inputs will react in accordance with ohm's law, and will have voltage oscillations that follow the input current. It can also be seen as a differential voltage input.

In the particular set-up of FIG. 1 and FIG. 2, voltage variations on the substrate taps 40, 50 will generate some capacitive cross-talk towards the differential outputs of the minority carrier collectors 20 and 30, which can be an unwanted side-effect in some applications. In order to rule out such capacitive cross-talk, another set-up of a mixer 306 in accordance with embodiments of the present invention can be conceived, as demonstrated in FIG. 3 and FIG. 4.

Figure 3:
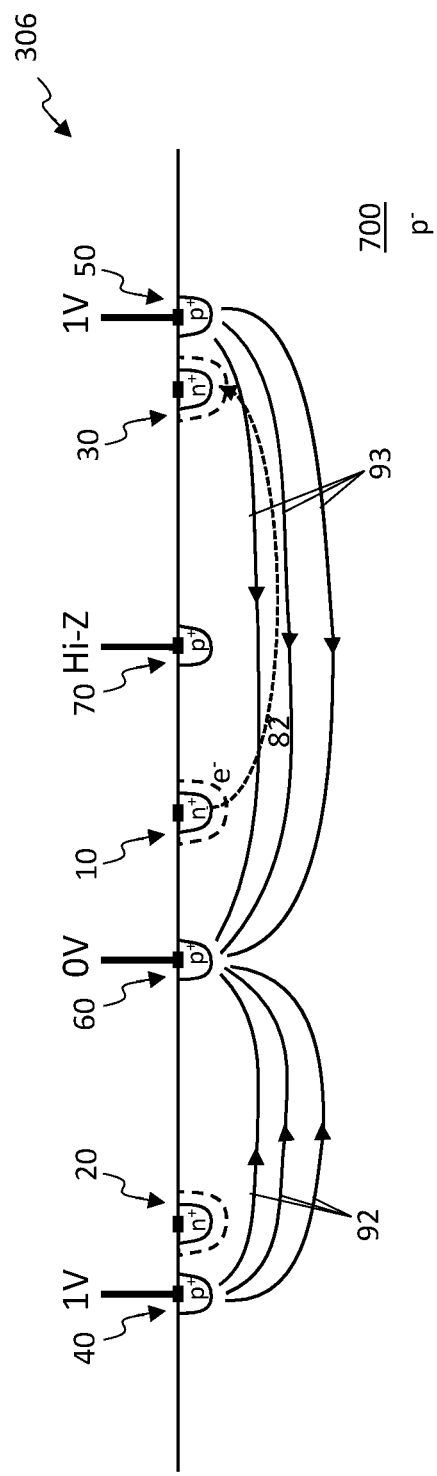
FIG. 3 and FIG. 4 show the cross section of a mixer structure in accordance with a second embodiment of the present invention.
Figure 4:
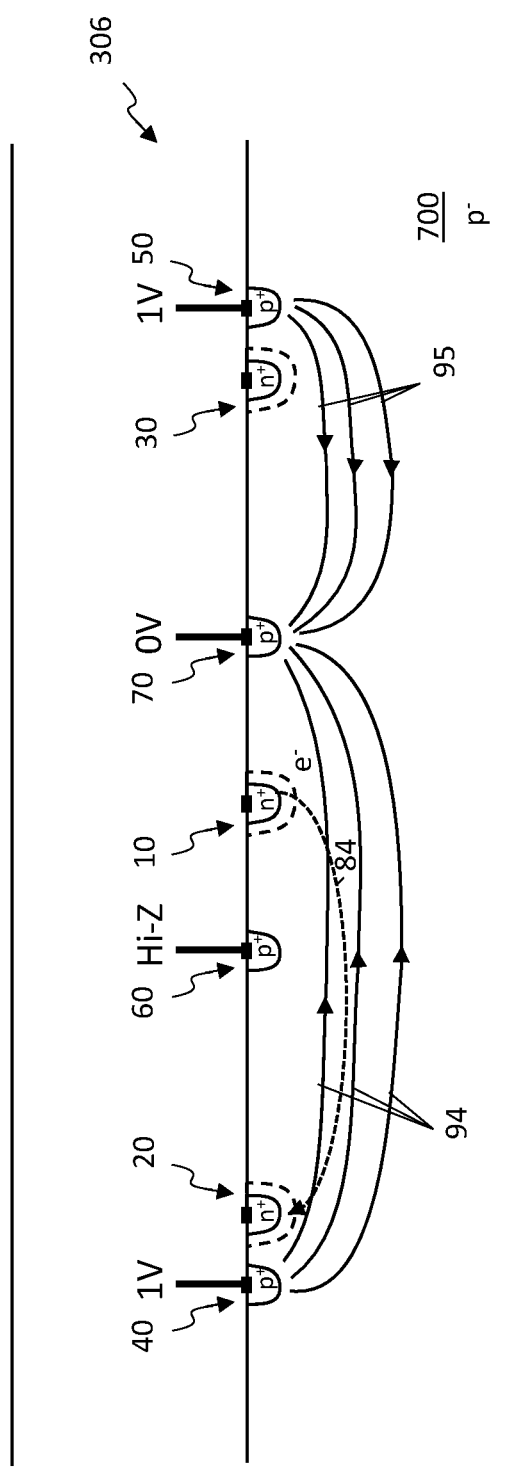

In FIG. 3 and FIG. 4, the substrate taps 40 and 50, adjacent to their respective minority carrier collectors 20 and 30, e.g. not farther away than a few hundreds of nanometers to a few micrometers, such as separated from one another between 100 nm and 10 μm, are kept at a constant voltage, e.g. 1 volt. The constant voltages at the substrate taps 40, 50 can be, but do not need to be, the same. However, most applications will perform better when balancing and/or providing symmetry. In between the two substrate taps 40, 50, for instance in the middle thereof, a minority carrier injector 10 is provided. A first and a second additional substrate taps 60 and 70, are located between the minority carrier injector 10 and the first and second substrate taps 40, 50, respectively, as indicated in FIG. 3 and FIG. 4. This means that the minority carrier injector 10 is located between, e.g. in the middle of, the first and second additional substrate taps 60, 70. The exact positions of the different components may depend on the required wanted performance, and may be designed in this respect by a person skilled in the art. In some embodiments, the structure can be very compact and components can be located close to one another. This may improve speed of operation, but more cross-talk (thus less good port-isolation) may be the effect.

The first and second additional substrate taps 60, 70 are alternately connected to ground, whilst the other is left floating (Hi-Z). In FIG. 3, the first additional substrate tap 60 is shorted to 0V, and the second additional substrate tap 70 is left floating. The majority carrier current densities 92 and 93 between the non-floating additional substrate tap 60 and the respective substrate taps 40, 50 are such, that a minority carrier, in the example illustrated an electron, that has been injected by minority carrier injector 10, gets directed according to indicated trajectory 82, towards minority carrier collector 30. Conversely, in FIG. 4, the second additional substrate tap 70 is shorted to 0V, and the first additional substrate tap 60 is left floating. The majority carrier current densities 94 and 95 between the non-floating additional substrate tap 70 and the respective substrate taps 40, 50 are such that a minority carrier, in the example illustrated an electron, that has been injected by minority carrier injector 10, now gets directed according to indicated trajectory 84, towards the other minority carrier collector 20. Majority carrier current densities 92, 93 as illustrated in FIG. 3, are in this example mixer 306 not opposite to the majority carrier current densities 94, 95 as illustrated in FIG. 4. Nevertheless, symmetry is still present for a good mixer balance. Further, capacitive cross-talk between the first additional substrate tap 60 and the minority carrier collector 20, and between the second additional substrate tap 70 and the minority carrier collector 30, will be much reduced, since the voltage potential of the substrate 700 adjacent to the minority carrier collectors 20, 30 is kept at a constant level by the substrate taps 40, 50, that are being held at a constant voltage, e.g. at 1 volt.

Although in all examples described hereinabove the substrate 700 is of a p-type semiconductor material, in accordance with embodiments of the present invention the substrate can be of any conductivity type. The resistivity of the substrate 700 may not be too low, e.g. preferably above 1 $\Omega \cdot cm$, or even better, e.g. not below 20 $\Omega \cdot cm$, and in some low power cases, or, when many mixers operate in parallel, preferably above 400 $\Omega \cdot cm$. Substrate 700 can be just an EPI-layer, e.g. of a few microns thickness, preferably larger than 5 micron thickness, and that layer can be on top of a high- or low-conductive wafer. It is possible to make the mixers in semiconductor on insulator (SOI), e.g. silicon on insulator, or in any CMOS technology, in semiconductor material such as Silicon or Germanium or in compound semiconductors, such as in a III-V semiconductor system. In SOI, a separated substrate well can be specifically designated to the mixer structure. In CMOS, the mixer structure can have guard rings around the entire mixer, or can be designed to operate in a deep N-well, where the N-well serves as the substrate 700.

Figure 5:
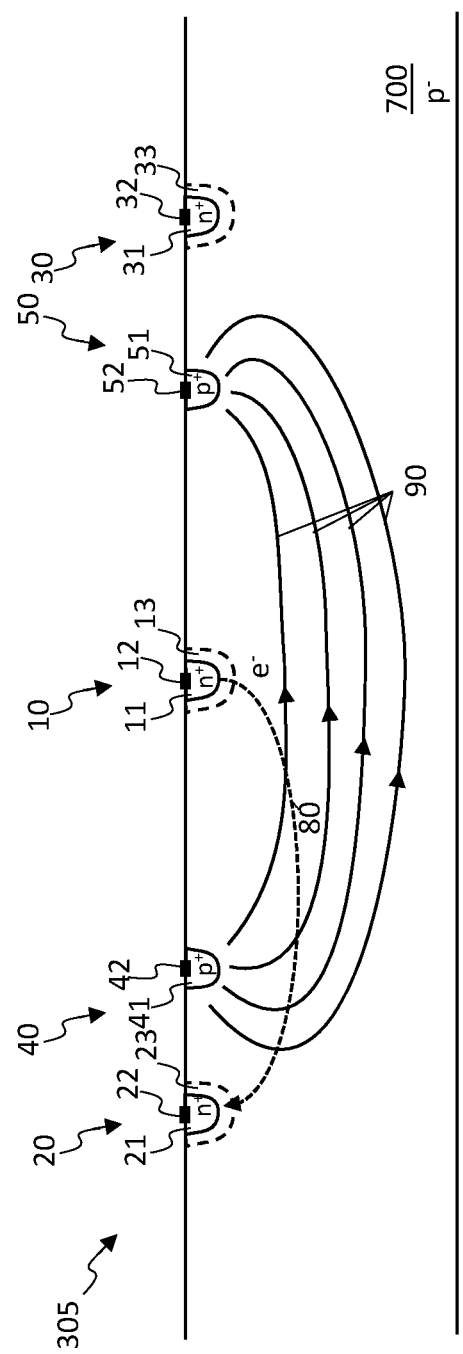
FIG. 5 show the cross section of a mixer structure in accordance with an alternative embodiment of the present invention.

Although in the examples described with respect to FIG. 1 to FIG. 4, the minority carrier collectors 20, 30 are each located between the minority carrier injector 10 and a substrate tap 40, 50, the invention is not limited thereto. In other embodiments, of which one is illustrated in FIG. 5, each substrate tap 40, 50 is located between the minority carrier injector 10 and a minority carrier collector 20, 30.

Figure 6:
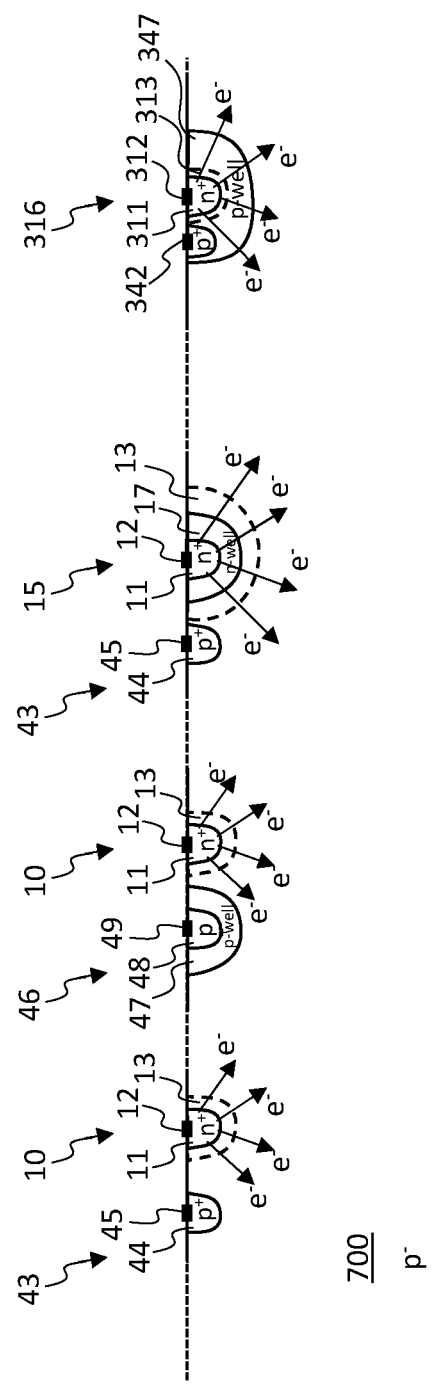
FIG. 6 shows minority carrier injectors with substrate taps.

FIG. 6 shows several embodiments of minority carrier injectors 10, 15 and 316 which can be used in accordance with embodiments of the present invention. They are illustrated on a substrate 700 of first conductivity type, in the example illustrated a p-type semiconductor substrate, the invention, however, not being limited thereto (one can for example also consider point contact diodes, and Schottky diodes). Minority carrier injector 10 at the left-hand side of the drawing is as also illustrated in FIG. 1 to FIG. 4. This implementation is the most basic one, and consists of an injection contact 12 to a contact region 11 in the substrate 700, which contact region is doped to form a region of a second conductivity type different from the first conductivity type of the substrate. The contact region 11 can for instance be, in case of a p-type substrate 700, an n+-diffusion, for instance an implant. The contact region 11 forms a pn-junction (diode) with the substrate 700, with depletion layer 13 being formed between the substrate material and the contact region 11. In order to generate the minority carrier injection, the minority carrier injector's pn-junction has to be forward biased such that a particular current level chosen by the designer of the circuit is obtained. On top of this DC bias, a signal is applied to the minority carrier injector 10. The variation on this signal, e.g. on the signal current, can then form the signal input to the mixer. This input can also be modulated digitally, with two current/voltage levels, small signal or large signal.

A special merit of a mixer in accordance with embodiments of the present invention is that an extreme small bias current can be large enough to operate the mixer, whereas for transistor mixers this is difficult because lack of speed or due to additional generated mixer noise. One way to forwardly bias the minority carrier injector, in the embodiment illustrated, is to apply a current sink, to contact 12. In that way, electrical current is extracted from contact 12 that is in connection with the contact region 11, in this embodiment the n+-diffusion, and therefore generates a forward pn junction between the local p--substrate 700 and the n+-diffusion 11. The n+-diffusion 11 should preferably be much higher doped, than the local p--substrate, leading to a good electron injection efficiency, i.e. most of the external sunk current to contact 12, is then converted into minority carriers. It is also possible to apply a current or voltage signal to an adjacent local substrate tap 43 (corresponding to substrate taps 40, 50 in the embodiments illustrated in FIG. 1 to FIG. 4) that will also have its effect on the minority carrier injector 10.

In FIG. 6 also several ways of forming a substrate tap 43, 46 are shown. Basically, a metallic contact 45, 49 is provided, with a local contact region 44, 48 of same conductivity type as the substrate 700 in which it is provided, e.g. p+-diffusion 44, 48, highly doped p+ (diffusion can also be an implant). Substrate tap 46 is shown as an alternative example whereby a p+-diffusion 48, is embedded in a p-well 47. Substrate taps 43, 46 here are shown adjacent to minority carrier injectors 10, however, they can also be used as the substrate taps adjacent to the minority carrier collectors 20, 30 or as additional substrate taps 60 or 70 for application of the majority carrier current densities. For each of the substrate taps, a small built-in potential barrier is automatically present between the highly doped contact region of first conductivity type, e.g. p+-diffusion 44, 47, and the local substrate lowly doped with dopants also of the first conductivity type, e.g. p--substrate 700. This built-in potential barrier prevents minority carriers present in the local substrate, e.g. p--substrate 700, to enter into the contact regions of same conductivity type, e.g. the p+-diffusions 44, 47, and to disappear into their respective contacts 45, 49.

FIG. 6 also illustrates another embodiment of minority carrier injector 15. In this embodiment, the minority carrier injector 15 comprises a highly doped contact region 11 of a conductivity type different from the conductivity type of the substrate 700, in the embodiment illustrated a n+ diffusion or implantation in a p- substrate. The contact region 11 is embedded in a well of conductivity type different from the conductivity type of the substrate 700, in the embodiment illustrated an n-well 17. The contact region 11 is provided with a contact 12 in connection thereto. As the well and the substrate touch one another, and have different conductivity types, a depletion region 13 forms between both. As in the previous embodiment of the minority carrier injector 10, also minority carrier injector 15 is illustrated next to a substrate tap 43, which is as the substrate tap 43 in connection with the minority carrier injector 10, and is not described here again.

In another embodiment, minority carrier injector 316 has its contact region 311 of conductivity type different from the conductivity type of the substrate, e.g. n+-diffusion, embedded in a well of same conductivity type as the substrate, e.g. in p-well 347. The well 347 has a highly doped contact region of same conductivity type as the well, e.g. a highly doped p+ diffusion or implant region, the highly doped contact region being contacted by contact 342. There is an injection contact 312 to the contact region 311. A depletion zone 313 is formed between the contact region 311 and the well 347. This is a candidate minority carrier injector 316 that, because of the presence of the p-well, will receive less cross-talk from the applied currents in the substrate 700. The injected current will hereby depend solely on the exact voltage between the contact 342 of the substrate tap and the contact 312 of the minority carrier injector 312. Keeping the voltage on contact 342 constant, will give very little cross-talk from the currents in the underlying substrate 700.

FIG. 7, FIG. 8 and FIG. 9 focus on minority carrier collection. A substrate tap 40 and a minority carrier collector 20 can be provided adjacent to each other, for instance at a depletion layer instance, but shorter is also possible, provided that the distance is not so short as to make a voltage breakdown happen. Alternatively, one minority carrier collector 20 can be provided between two substrate taps 40, 40'. Or a substrate tap 40 can be provided between two minority carrier collectors 20, 20'. FIG. 7 shows the cross-sections of the embodiments illustrated in top view in FIG. 8. FIG. 9 shows an alternative configuration 141, whereby substrate tap 140 completely surrounds minority carrier collector 20. Also, configuration 121 is shown whereby minority carrier collector 120 completely surrounds substrate tap 40.

A minority carrier collector 220 with its substrate tap 221 is shown in FIG. 7 and FIG. 8, having bipolar transistor current output-gain. A well 214 of opposite conductivity type as the substrate, e.g. an n-well 214, serves as the collector for the minority carriers. In the well 214 is embedded a highly doped region 211, of conductivity type different from the conductivity type of the well, e.g. a p+-diffusion or implantation, that is contacted by contact 212. The p+-diffusion 211, in the embodiment illustrated, operates as an emitter of a PNP bipolar transistor. The n-well 214 forms the base, and the local p- substrate with the substrate tap 221 (contact region 41, contact 42) forms the collector. The minority carriers arriving at the n-well 214, arrive thus at the base of the transistor, and will generate a current gain of 100-250 provided by holes that get emitted from the emitter 211 through the base 214 into the collector. The collected holes have to be sunk, and this can happen through tap 221. The output current available at contact 212 will benefit from the current gain. Base contact 215 is provided as an optional contact, potentially to reset the transistor at the start of a mixing period.

Figure 10:
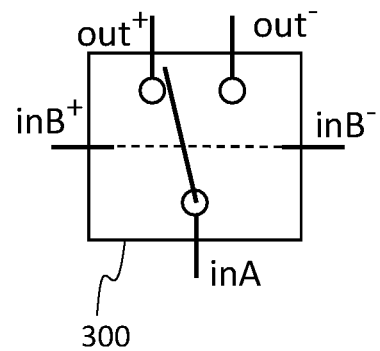
FIG. 10 shows a mixer in accordance with embodiments of the present invention.
Figure 11:
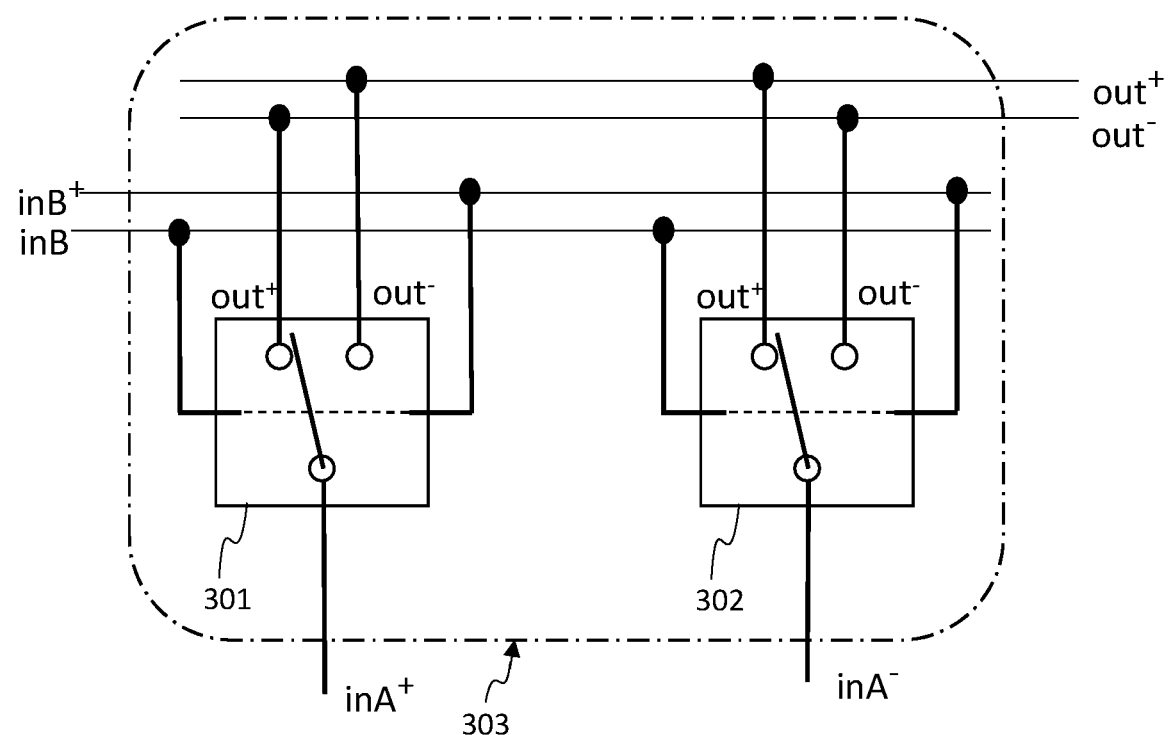
FIG. 11 illustrates a double balanced mixer in accordance with embodiments of the present invention.

FIG. 10 and FIG. 11 show top-level signal connection schematics.

Mixer 300 schematically illustrated in FIG. 10 can be any mixer in accordance with embodiments of the present invention, that has a first electrical signal input that is single ended input inA (connected to the minority carrier injector), a second electrical signal input that is differential (inB+, inB−) (connected to two substrate taps), and a differential signal output (out+, out−) (connected to two minority carrier collectors). One example of such mixer is illustrated in cross section in FIG. 1 and FIG. 2.

As illustrated in FIG. 11, for configuring a double balanced mixer 303 (=four quadrant mixer) in accordance with embodiments of the present invention, two mixers 301,302 of the type 300 as illustrated in FIG. 10, can be connected in way 303, such that the first input becomes also a differential signal (inA+, inA−).

Further, one of the differential inputs InB+, InB−, eg. InB− can be biased permanently to a certain voltage, and the terminal InB+ of the pair can be used as a single-ended input. Basically, the inputs and the output of the mixer can be configured to be single-ended or differential by the person skilled in the art.

The inputs of a mixer in accordance with embodiments of the present invention can be operated by applying analog signals, digital signals, voltages and/or currents. The first input InA (single ended or differential) preferably has a current bias, possibly with a voltage signal AC-coupled on top. Or on top of the bias signal can be summed a current signal. The second input InB (single ended or differential), can be operated by applying voltages, or currents, or one can apply a voltage through an impedance if that is more appropriate. When designing wireless receivers, all the known circuits in this art can be applied, including, but not limited to, the use of inductors, (bandpass-) filters, transformers, amplifiers before connection to one of the inputs. A differential current is provided at the output, that can be used in a subsequent circuitry in any way that is known in the art, including the use of cascode circuits, current mirrors circuits, resistors (making direct outputs voltages), or transimpedance operational amplifier circuits. Even integrating the current on a capacitor is an option, possibly using a reset transistor for starting a measurement period.

Figure 12:
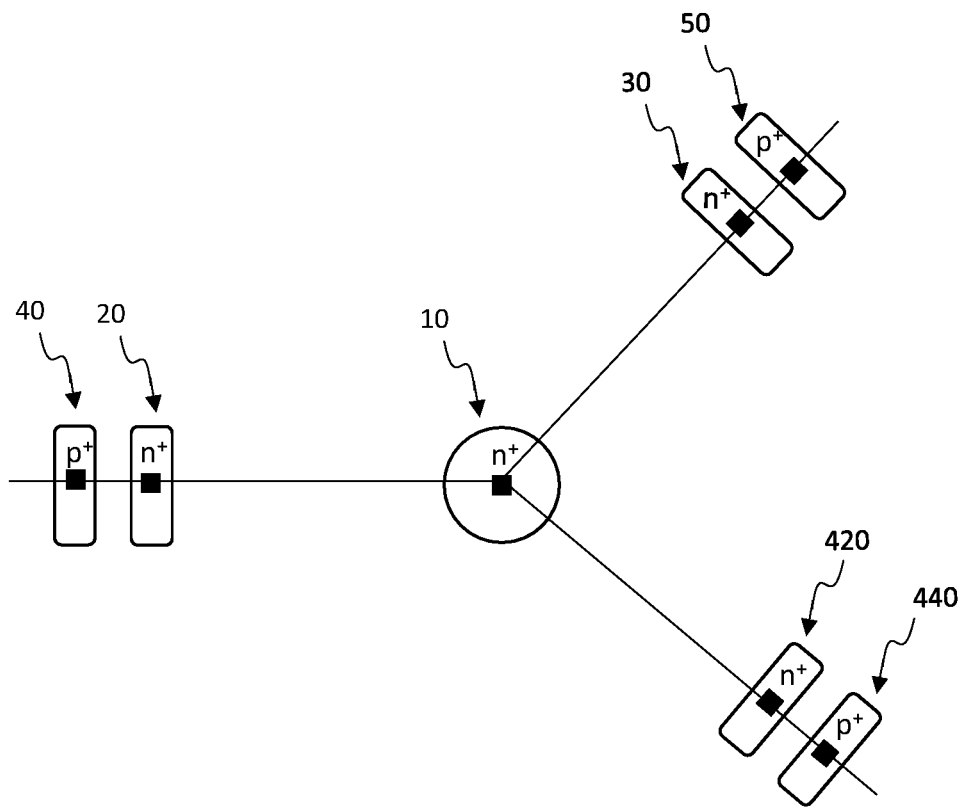
FIG. 12 illustrates a mixer with a three phase input and a three phase output, according to embodiments of the present invention.

FIG. 12 shows an embodiment whereby the input applied to the substrate taps 40, 50, 440 can be a three-phase signal, and the output provided by the minority carrier collectors 20,30, 420 can also be a three-phase signal with a single-ended input signal delivered to minority carrier injector 10.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

For example, first and second conductivity types can be switched as appropriate. The skilled person will realize that, this way, flow directions of current may switch, and bias directions may change, but these changes do not require any extraordinary skills from the person skilled in the art.

The invention claimed is:

1. A method of mixing a first electrical signal with a second electrical signal using a mixer for mixing a first electrical signal with a second electrical signal, the mixer including
   a substrate of a first conductivity type,
   at least one minority carrier injector for injecting minority carriers in the substrate in reply to the first electrical signal applied to the at least one minority carrier injector,
   at least two substrate taps located in the substrate for providing a majority carrier current density with an associated electric field in the substrate in reply to the second electrical signal applied to the at least two substrate taps, the associated electric field of the major carrier current density determining a drift direction of the injected minority carriers,
   at least two minority carrier collectors located in the substrate for collecting the minority carriers from the substrate, each minority carrier collector being located close to one of the at least two substrate taps, wherein, in use, a minority carrier collector destination is determined by the drift direction of the injected minority carriers, currents outputted by the minority carrier collectors based on the collected minority carriers forming an output signal of the mixer,
   the method comprising:
   applying the first electrical signal to the at least one minority carrier injector, thus generating a minority carrier current in the substrate;
   applying the second electrical signal between the at least two substrate taps, thus generating a majority carrier current in the substrate, the majority carrier current having an associated electric field guiding the minority carriers in the substrate in an opposite direction of the majority carrier current; and
   collecting the minority carriers from the substrate by means of the at least two minority carrier collectors.

2. The method according to claim 1, wherein the applied second electrical signal is an n-phase signal for a number of n substrate taps.

3. The method according to with claim 1, wherein the mixer output signal is an m-phase output signal for a number of m minority carrier collectors.

4. The method according to claim 1, comprising subsequent elements in the following order:
   a first substrate tap of the at least two substrate taps, a first minority carrier collector of the at least two minority carrier collectors, a first minority carrier injector of the at least one minority carrier injector, a second minority carrier collector of the at least two minority carrier collectors, and a second substrate tap of the at least two substrate taps.

5. The method according to claim 1, wherein the mixer comprises the subsequent elements in the following order:
   a first minority carrier collector of the at least two minority carrier collectors, a first substrate tap of the at least two substrate taps, a first minority carrier injector of the at least one minority carrier injector, a second substrate tap of the at least two substrate taps, and a second minority carrier collector of the at least two minority carrier collectors.

6. The method according to claim 1, wherein the at least one minority carrier injector comprises a highly doped contact region of second conductivity type different from the first conductivity type.

7. The method according to claim 6, wherein the highly doped contact region is provided in a well of the first or the second conductivity type.

8. The method according to claim 7, wherein the well furthermore comprises a contact region of the first conductivity type.

9. A method for mixing a first electrical signal with a second electrical signal, the method comprising:

generating, in response to the second electrical signal, a majority carrier current in a substrate extending between at least two substrate taps provided on the substrate;

injecting, in response to the first electrical signal, minority charge carriers in the substrate at an injection spot provided on the substrate in between the at least two substrate taps;

guiding the minority charge carriers in the substrate by means of the majority carrier current, in a direction opposite to a direction of the majority carrier current to at least one collection spot, said at least one collection spot being provided on the substrate close to a substrate tap of the at least two substrate taps; and collecting minority charge carriers thus provided at the at least one collection spot, thus obtaining a mixed signal output.

10. The method according to claim 9, wherein at least one of the first and second electrical signals is a time variant signal.

* * * * *